(12) United States Patent
Sun

(10) Patent No.: US 7,852,624 B2
(45) Date of Patent: Dec. 14, 2010

(54) SERVER ENCLOSURE

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 125 days.

(21) Appl. No.: 12/237,662

(22) Filed: Sep. 25, 2008

(65) Prior Publication Data

US 2009/0296339 A1 Dec. 3, 2009

(30) Foreign Application Priority Data

May 30, 2008 (CN) .......................... 2008 1 0301871

(51) Int. Cl.
*G06F 1/16* (2006.01)

(52) U.S. Cl. .............................. 361/679.54; 312/223.2; 211/41.17; 360/98.04

(58) Field of Classification Search ............ 361/679.33, 361/679.36, 679.34, 679.35, 679.37, 679.38, 361/679.54, 679.49, 679.02, 679.53, 679.21, 361/679.27; 312/223.2, 223.3, 223.4; 211/41.17; 360/97.1, 98.04; 62/259.2; 455/127.1
See application file for complete search history.

(56) References Cited

U.S. PATENT DOCUMENTS

| | | | |
|---|---|---|---|
| 6,381,130 B1 * | 4/2002 | Yen | 361/679.33 |
| 7,167,359 B2 * | 1/2007 | Wendel et al. | 361/679.36 |
| 2004/0037034 A1 * | 2/2004 | Suzuki et al. | 361/687 |

* cited by examiner

*Primary Examiner*—Hung V Duong
(74) *Attorney, Agent, or Firm*—Clifford O. Chi

(57) ABSTRACT

A server enclosure includes an enclosure body, hard disk drives (HDDs), and heat dissipating devices. The enclosure body includes HDD receiving spaces. The HDD receiving spaces are positioned at one end portion of the enclosure body. Each of the receiving spaces receives one of the heat dissipating device or one of the HDDs.

12 Claims, 6 Drawing Sheets

SERVER ENCLOSURE

CROSS-REFERENCE TO RELATED APPLICATIONS

The present application is related to a copending U.S. patent application, titled "HEAT DISSIPATING DEVICE AND SUPPORTING ELEMENT THEREOF", with the application Ser. No. 12/237,710, assigned to the same assignee as the present application, the disclosure of which is incorporated herein by reference, filed concurrently herewith.

BACKGROUND

1. Field of the Invention

The present invention relates to a server enclosure, and particularly, to a server enclosure with heat dissipating devices.

2. Description of Related Art

A typical server accommodates a number of electronic components. As more components are installed in the server, more heat is generated and heat dissipation becomes increasingly important.

Referring to FIGS. 5 and 6, a typical server enclosure 200 includes a plurality of receiving spaces 210 configured for receiving a plurality of hard disk drives 120. Some of the receiving spaces 210 may not be used, so a corresponding numbers of dummy blocks 211 need to be inserted into the receiving spaces 210 to keep air flow in the sever enclosure 200 uniform.

Therefore, it is desired to provide a server enclosure to overcome the above-described shortcoming.

DETAILED DESCRIPTION OF THE EMBODIMENTS

Figure 1:
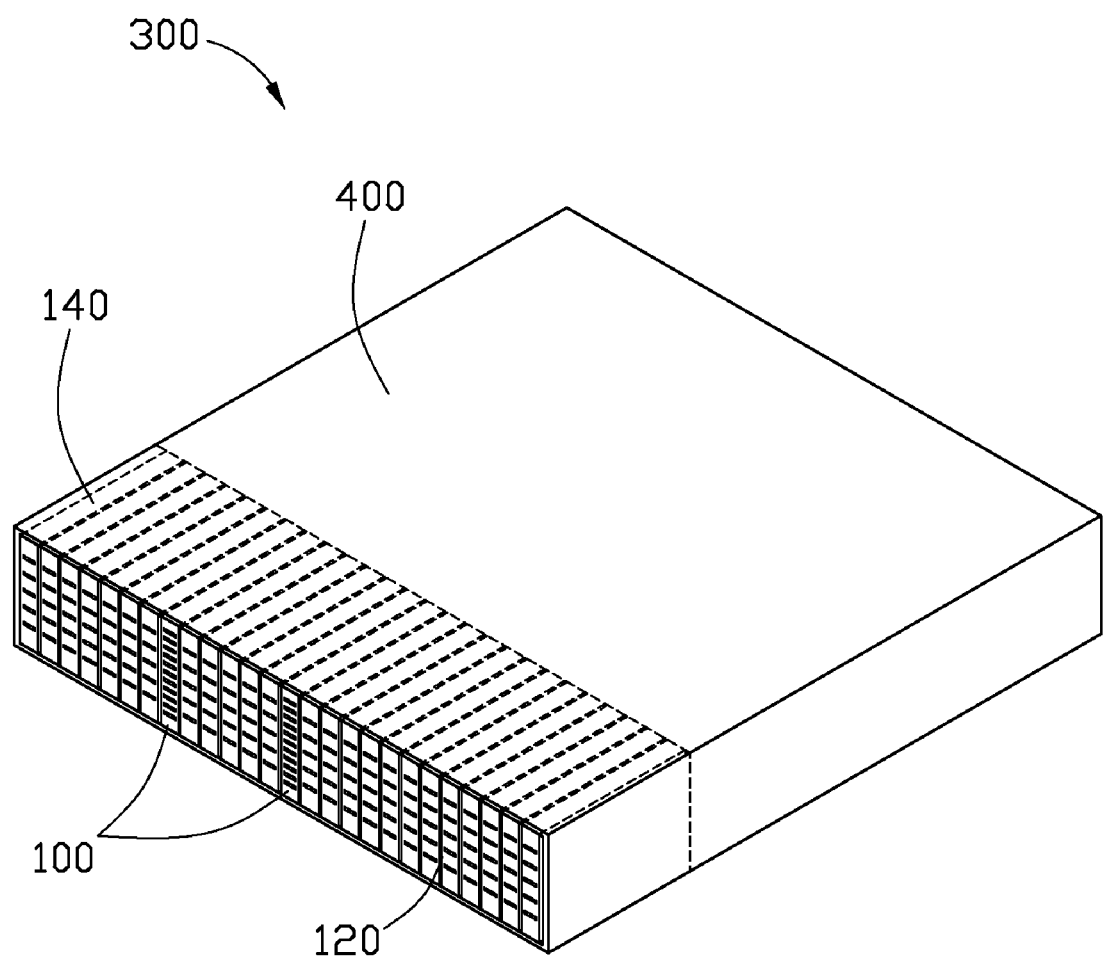
FIG. 1 is an isometric view of an embodiment of a server enclosure, the server enclosure including an enclosure body.

Referring to FIG. 1, an embodiment of a server enclosure 300 includes an enclosure body 400. A plurality of parallel receiving spaces 140 is arranged at an end portion of the enclosure body 400. Each receiving space 140 is configured for receiving one of a plurality of hard disk drive (HDD) 120 or one of a plurality of heat dissipating devices 100. A shape of the heat dissipating device 100 may be similar to a shape of the HDD 120.

Figure 2:
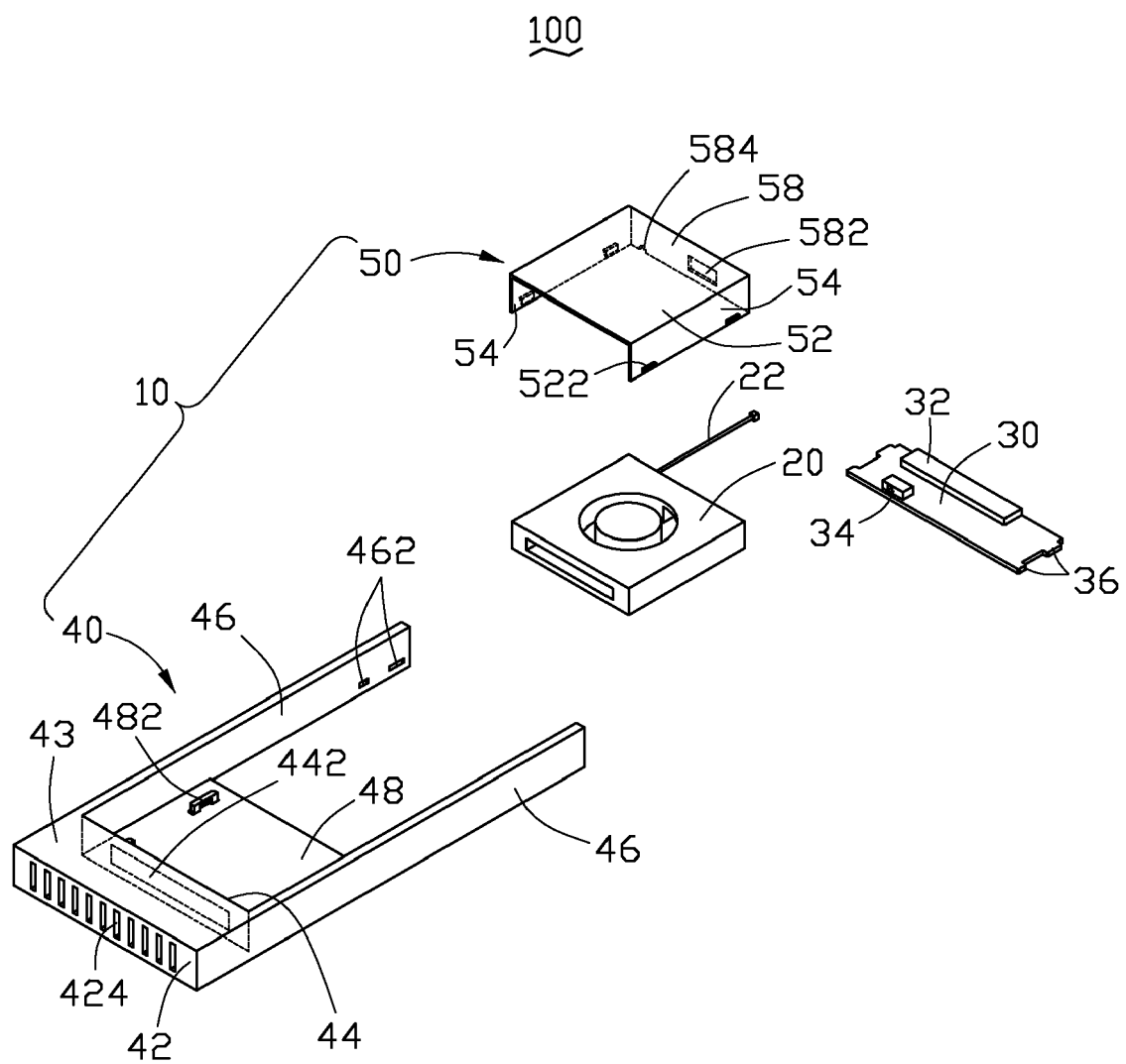
FIG. 2 is an exploded, isometric view of a heat dissipating device installed in an HDD receiving space of the server enclosure of FIG. 1.

Referring to FIG. 2, each heat dissipating devices 100 includes a bracket 40, a heat dissipater 20, such as a blower, and a circuit board 30 to power the heat dissipater 20. In the illustrated embodiment, the heat dissipating device 100 further includes a cover 50. A supporting element comprises the bracket 40 and the cover 20.

The bracket 40 includes an outside wall 42, an inside wall 44 substantially parallel to the outside wall 42, a pair of sidewalls 46 extending substantially perpendicularly from opposite ends of the outside wall 42 and opposite ends of the inside wall 44, and a rectangular bottom wall 48 substantially perpendicularly positioned between the sidewalls 46 and connected to the inside wall 44. The outside wall 42, the inside wall 44, and the sidewalls 46 cooperatively define a hollow chamber 43. The inside wall 44, the sidewalls 46, and the bottom wall 48 cooperatively define a receiving cavity (not shown) to receive the heat dissipater 20. A plurality of air inlets 424 is defined in the outside wall 42 to communicate the receiving cavity with the outside. An air intake 442 is defined in the inside wall 44 to communicate with the air inlets 424 via the hollow chamber 43. Two slots 462 are defined in an end portion of each sidewall 46. A plurality of latches 482 extends from corners of the bottom wall 48.

The cover 50 includes a top plate 52, a pair of side plates 54 extending substantially perpendicularly from opposite sides of the top plate 52, and an end plate 58 extending substantially perpendicularly from an end of the top plate 52. A plurality of latching blocks 522 extends from a lower portion of each side plate 54, corresponding to the plurality of latches 482. An air outlet 582 is defined in the end plate 58. A through hole 584 is defined in the end plate 58, and configured to allow a power line 22 of the heat dissipater 20 to extend therethrough.

The circuit board 30 includes a first power connector 32 positioned on the circuit board 30, a second power connector 34 positioned on the circuit board 30, and two pairs of protrusions 36 having different sizes. Each pair of protrusions 36 extends from opposite ends of the circuit board 30. The first connector 32 is electrically communicating with the second connector 34. The second connector 34 is connected to the heat dissipater 20 via the power line 22 of the heat dissipater 20.

Figure 3:
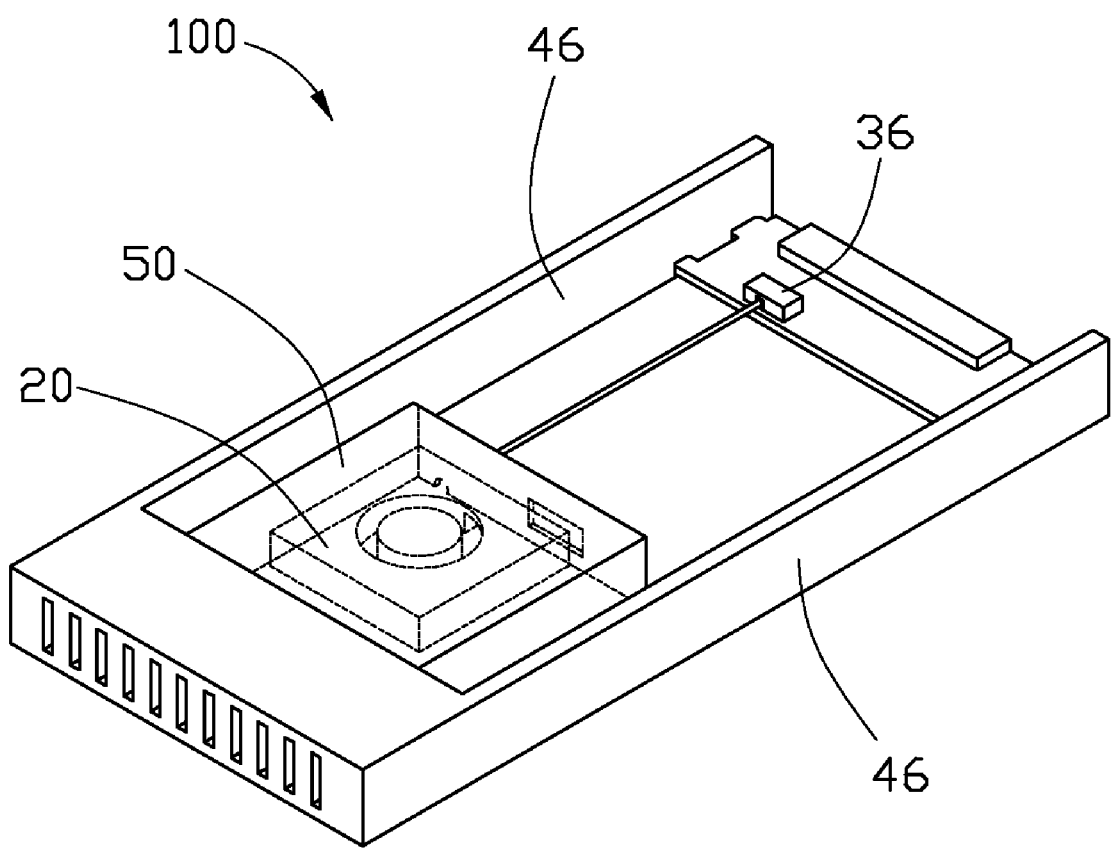
FIG. 3 is an assembled view of FIG. 4.

Referring to FIG. 3, the heat dissipater 20 is received in the receiving cavity of the bracket 40. In one embodiment, the cover 50 is attached to the bracket 40 to shield the heat dissipater 20, by engaging the plurality of latching blocks 522 with the plurality of latches 482. The circuit board 30 is attached to the sidewalls 46 of the bracket 40 by engaging the protrusions 36 in the slots 462.

In use, the heat dissipating device 100 is inserted into one of the HDD receiving spaces 140. The first connector 32 is connected to an HDD interface (not shown) of the server enclosure 300 to power the heat dissipater 20. The heat dissipater 20 is configured to bring in outside air into the enclosure body 400 via the air inlet 424 and the intake 442. The air is then guided into the enclosure body 400 via the air outlet 582 to cool the server enclosure 300.

Figure 4:
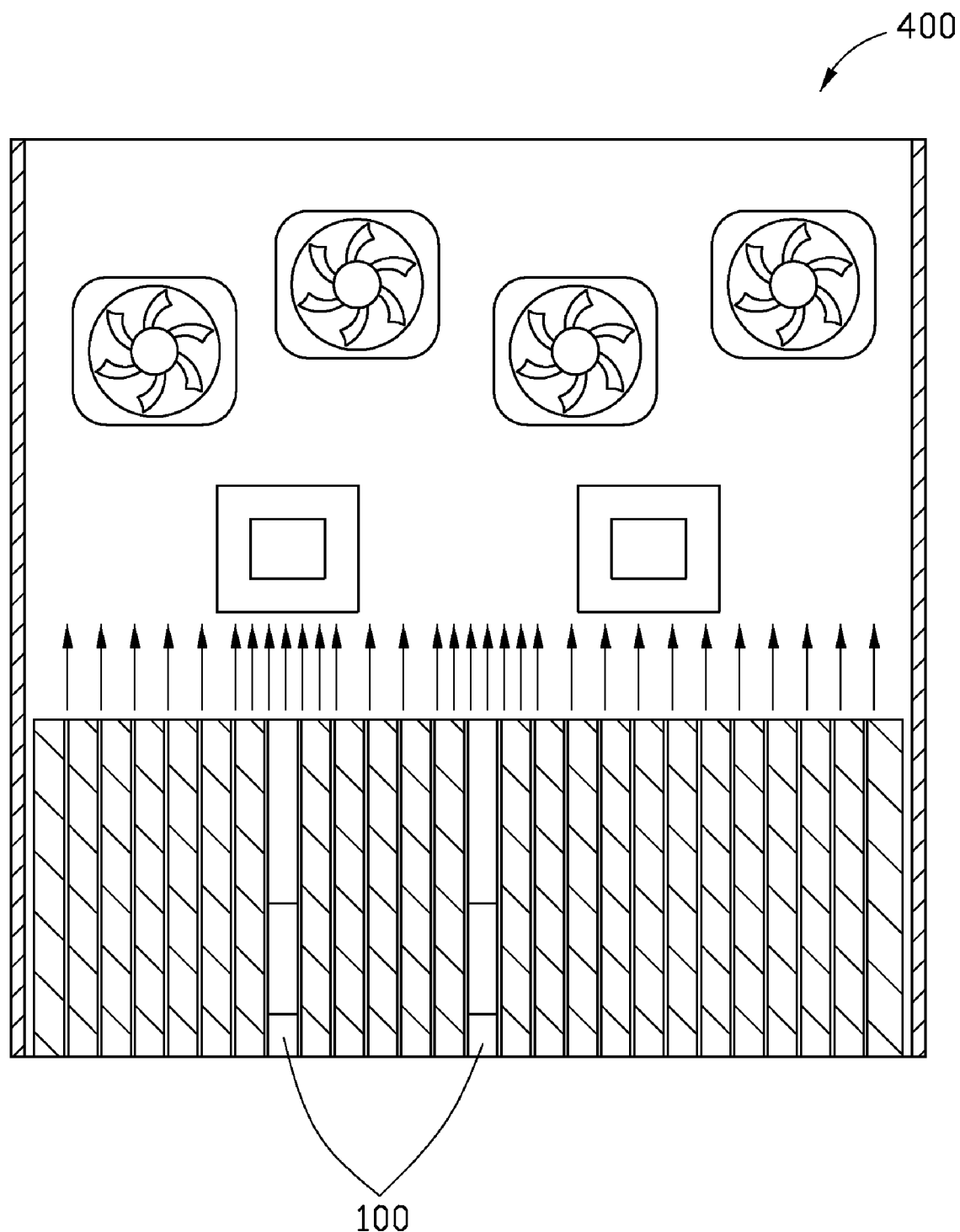
FIG. 4 is an airflow distributing schematic diagram of FIG. 5.
Figure 5:
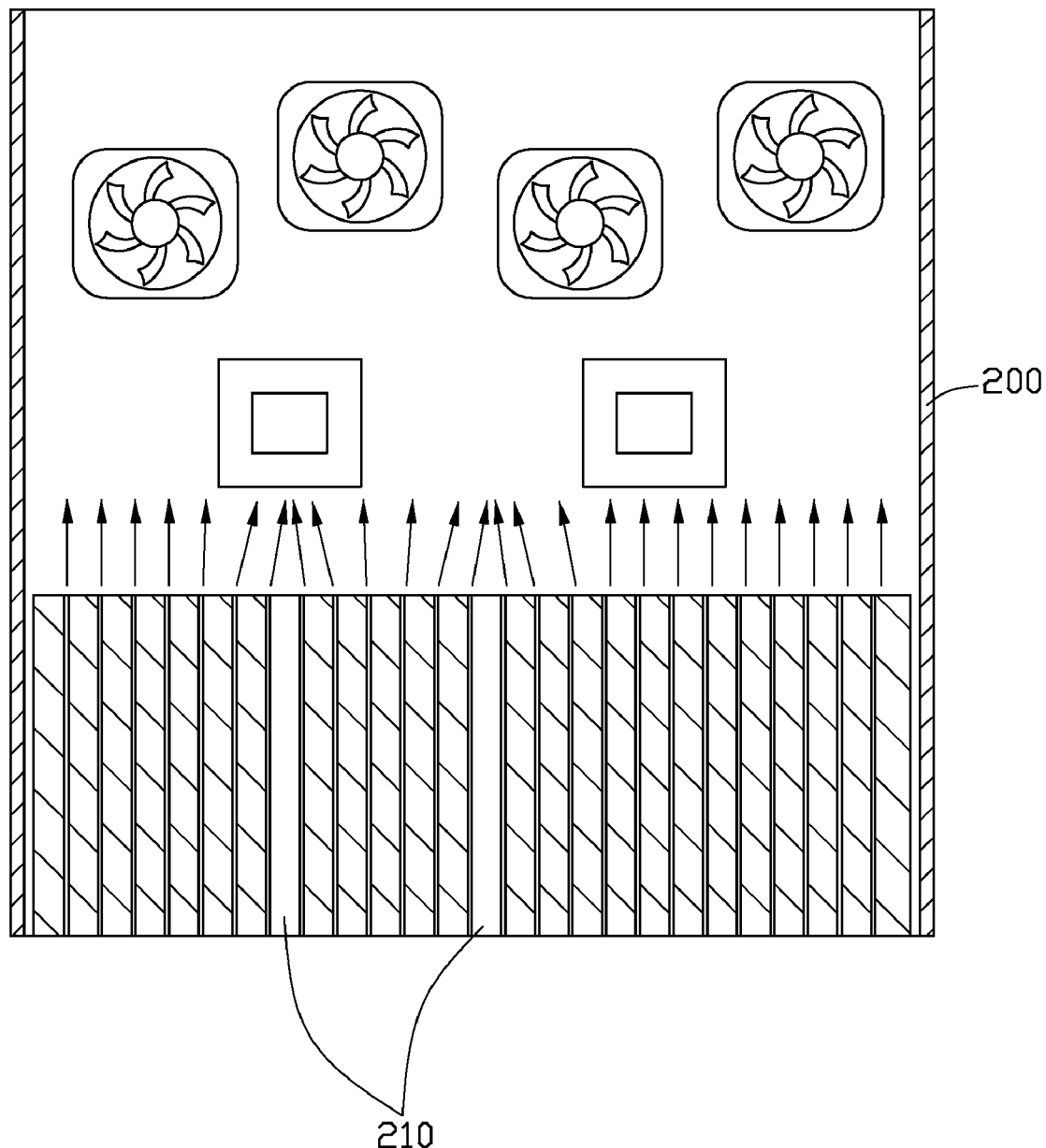
FIG. 5 is a schematic view of a typical server enclosure with unoccupied hard disk receiving portions.
Figure 6:
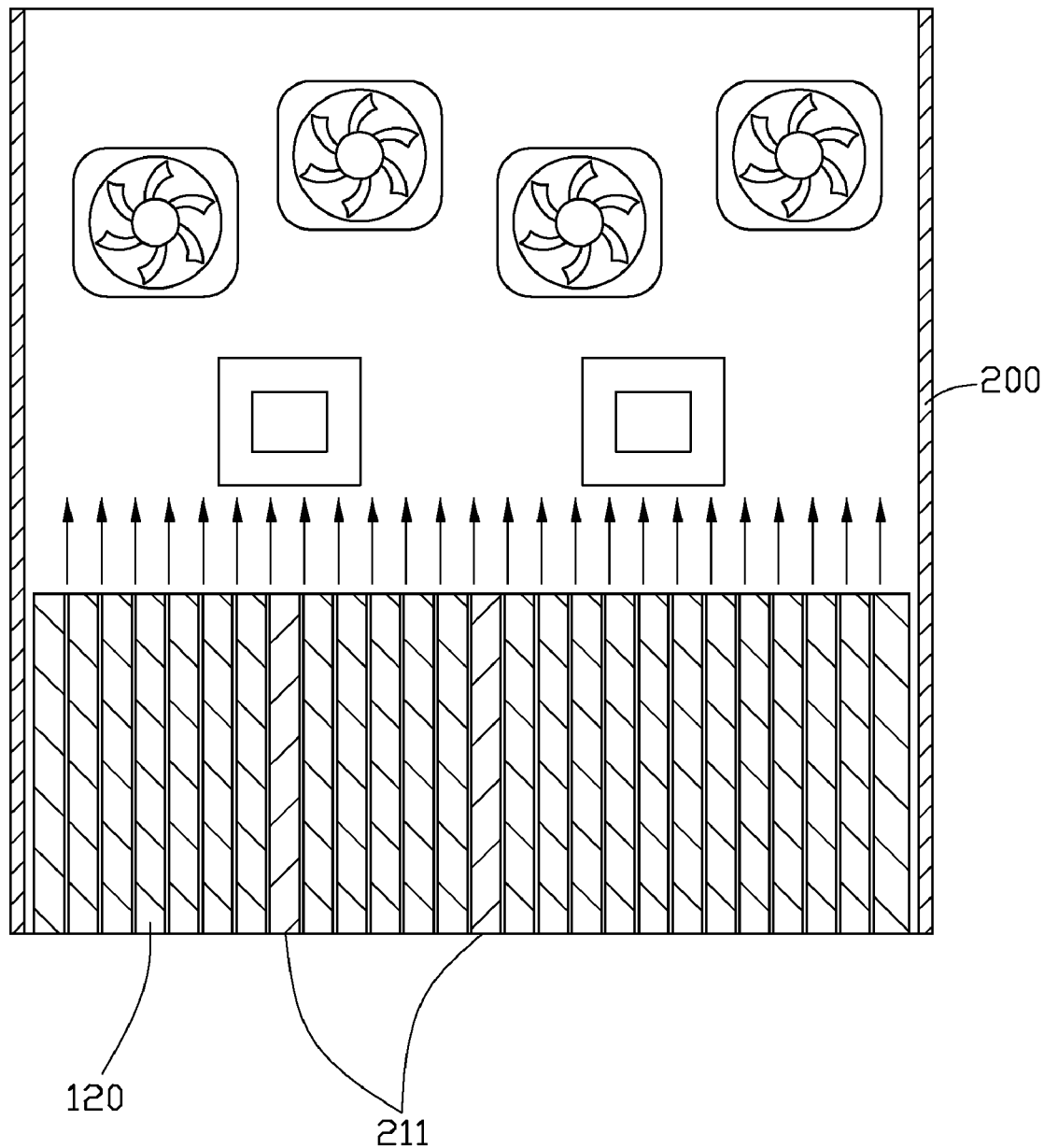
FIG. 6 is a schematic view of a typical server enclosure wherein unoccupied hard disk receiving portions receive bogus hard disks.

Referring to FIG. 4, the server enclosure 300 is shown, for exemplary purposes only, with two heat dissipating devices 100 installed in two idle receiving spaces to achieve a better heat dissipation performance than the typical server enclosure with two dummy blocks installed in the two idle receiving space (shown in FIG. 6).

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server enclosure comprising:
   an enclosure body comprising a plurality of parallel hard disk drive (HDD) receiving spaces arranged at an end portion of the enclosure body;
   at least one HDD; and
   at least one heat dissipating device, the at least one heat dissipating device comprising a bracket, a heat dissipater attached in the bracket, and a circuit board supplying power to the heat dissipater;
   wherein each receiving space receives a computer component selected from the group consisting of the at least one heat dissipating device and the at least one HDD.

2. The server enclosure as claimed in claim 1, wherein each bracket comprises an outside wall, an inside wall, a pair of sidewalls extending substantially perpendicularly from opposite ends of the outside wall and opposite ends of the inside wall, and a bottom wall substantially perpendicularly positioned between the sidewalls and connected to the inside wall; the outside wall, the inside wall, the sidewall cooperatively define a hollow chamber; the inside wall, the sidewalls, and the bottom wall cooperatively define a receiving cavity to receive the heat dissipater; each circuit board is fixed on a distal end of the pair of the sidewalls.

3. The server enclosure as claimed in claim 2, wherein an air inlet is defined in the outside wall of each bracket to communicate the receiving cavity with the outside; an air intake is defined in the inside wall of each bracket, and communicating with the air inlet.

4. The server enclosure as claimed in claim 2, wherein two slots are defined in an end portion of each sidewall; two pair of protrusions extend from opposite edges of each circuit board to engage with the two slots of each sidewall to fix the circuit board.

5. The server enclosure as claimed in claim 2, wherein each heat dissipating device further comprises a cover, the cover comprises a top plate, a pair of side plates extending substantially perpendicularly from opposite sides of the top plate, and an end plate extending substantially perpendicularly from an end of the top plate; an air outlet is defined in each end plate; a through hole is defined in each end plate, and configured to allow a power line of the heat dissipater to extend therethrough.

6. The server enclosure as claimed in claim 5, wherein each side plate comprises a pair of latching blocks extending from a lower portion; four latches extend from corners of the bottom wall to mate with the pairs of latching blocks.

7. The server enclosure as claimed in claim 1, wherein each circuit board comprises a first power connector positioned at a first side of the circuit board and a second power connector positioned at a second side of the circuit board to power the heat dissipater.

8. The server enclosure as claimed in claim 7, wherein each heat dissipater is a blower.

9. A server enclosure comprising:
   an enclosure body comprising a plurality of equal sized hard disk drive (HDD) receiving spaces;
   a plurality of equal sized HDDs, each capable of being fitted in each receiving space; and
   at least one heat dissipating device comprising a bracket having a same size as each HDD, and a blower installed in the bracket;
   wherein the at least one heat dissipating device is received in one of the receiving spaces to replace one of the HDDs if one receiving space is idle.

10. The server enclosure as claimed in claim 9, wherein the at least one heat dissipating device further comprises a circuit board installed in the bracket to supply power to the blower.

11. The server enclosure as claimed in claim 10, wherein the circuit board comprises a first power connector connected to an HDD interface of a server to receive power from the server, and a second power connector connected to the blower to transmit the power to the blower.

12. The server enclosure as claimed in claim 9, wherein the plurality of equal sized HDD receiving spaces are arranged in parallel.

* * * * *